US009991074B2

(12) United States Patent
Herzog et al.

(10) Patent No.: US 9,991,074 B2
(45) Date of Patent: Jun. 5, 2018

(54) SAFETY-ORIENTED LOAD SWITCHING DEVICE AND METHOD FOR OPERATING A SAFETY-ORIENTED LOAD SWITCHING DEVICE

(71) Applicant: FESTO AG & Co. KG, Esslingen (DE)

(72) Inventors: Andreas Herzog, Weinstadt (DE); Martin Gehrke, Weinstadt (DE)

(73) Assignee: FESTO AG & CO. KG, Esslingen (DE)

( * ) Notice: Subject to any disclaimer, the term of this patent is extended or adjusted under 35 U.S.C. 154(b) by 166 days.

(21) Appl. No.: 15/209,159

(22) Filed: Jul. 13, 2016

(65) Prior Publication Data
US 2017/0018383 A1    Jan. 19, 2017

(30) Foreign Application Priority Data

Jul. 14, 2015 (DE) .......................... 10 2015 213 156

(51) Int. Cl.
*H01H 47/00* (2006.01)
*G01R 31/327* (2006.01)

(52) U.S. Cl.
CPC ....... *H01H 47/002* (2013.01); *G01R 31/3277* (2013.01)

(58) Field of Classification Search
CPC .......................... H01H 47/002; G01R 31/3277
See application file for complete search history.

(56) References Cited

FOREIGN PATENT DOCUMENTS

| DE | 102007002953 | 7/2008 |
|---|---|---|
| DE | 102010004524 | 7/2011 |
| DE | 102010007784 | 8/2011 |

*Primary Examiner* — Robert Deberadinis
(74) *Attorney, Agent, or Firm* — Hoffmann & Baron, LLP

(57) ABSTRACT

A safety-oriented load switching device including a first current branch, which extends from a first supply connection to a first load connection and having a first switching means, and having a second current branch, which extends from a second supply connection to a second load connection and including a second switching means, wherein a first test branch is connected to a first measuring point located between the first switching means and the first load connection and is also connected to the second supply connection and includes a series connection of a first test switch and a first measuring device, wherein a second test branch is connected to a second measuring point between the second switching means and the second load connection and is connected to the first supply connection and includes a series connection of a second test switch and a second measuring device.

10 Claims, 2 Drawing Sheets

SAFETY-ORIENTED LOAD SWITCHING DEVICE AND METHOD FOR OPERATING A SAFETY-ORIENTED LOAD SWITCHING DEVICE

BACKGROUND OF THE INVENTION

The invention relates to a safety-oriented load switching device for electrical control of an automation component comprising a first current branch, which extends from a first supply connection to a first load connection and which includes a first switching means, which selectively interrupts the first current branch, and comprising a second current branch, which extends from a second supply connection to a second load connection and which includes a second switching means, which selectively interrupts the second current branch. The invention also relates to a method for operating a safety-oriented load switching device.

A device for electric circuit monitoring of an electrical load circuit comprising at least one electrical load, wherein two supply voltage connections are connected to the two load connections by means of current paths each comprising one first semiconductor switch is known from DE 10 2010 004 524 A1. The current detecting means serve to detect the current in each of the two current paths. The series connection of a further second semiconductor switch and a low-current shunt is connected in parallel with each high-current shunt in each of the two current paths, wherein the two connections of the low-current shunt are each connected to the current detecting means.

SUMMARY OF THE INVENTION

The object of the invention is to provide a safety-oriented load switching device and a method for operating a safety-oriented load switching device, which enable reliable detection of faulty electrical connections between at least one of the current branches and an electric potential, in particular a further supply potential or earth potential, which involves minimal complexity in terms of circuitry.

This object is achieved for a safety-oriented load switching device of the type referred to above in which a first test branch is connected to a first measuring point located between the first switching means and the first load connection, wherein the first test branch is connected to the second supply connection and comprises a series connection of a first test switch and a first measuring device and wherein a second test branch is connected to a second measuring point located between the second switching means and the second load connection wherein the second test branch is connected to the first supply connection and comprises a series connection of a second test switch and a second measuring device.

The safety-oriented load switching device is provided for two-channel disconnection of the electrical supply to the load. A switching means is included in each of the current branches for this purpose, which can effect a separation or disconnection of the respective current branch and thus interrupt an electrical connection between the supply connection and the load connection.

Furthermore, an individual testing device in the form of the respective test branch is assigned to each of the current branches and consequently each of the current branches can also be tested individually for malfunctions, particularly with regard to the switching function of the respective switching means, and the presence of a faulty electrical connection to an electric potential, in particular a further supply potential or earth potential. The safety-oriented load switching device allows testing during operation of the load and consequently either of the two current branches can be tested for the presence of malfunctions at any time without this impairing the function of the load.

When testing the load switching device, the respective test switch helps establish a temporary electrical connection between the respective measuring point and the respective supply connection by way of the assigned test branch thus short-circuiting the load. In the first instance, electrical energy is discharged as a result, which is stored in the load in a capacitive and/or inductive manner, preferably within a very short space of time. The load is an automation component such as a magnetic valve, for example. The load is conventionally connected to supply connections only by way of the two load connections; other electrical connections of the load to the supply voltage and/or a further voltage potential and/or earth potential are considered faults to be detected with the help of the load switching device.

Once the electrical discharging of the load is complete and the normal current flow in the load switching device has disappeared without the presence of a fault, a test can be performed using the measuring device whether a faulty electrical connection to an electric potential, in particular to a further supply potential or earth potential, affects the connected load and/or the load switching means in spite of the respectively open switching means in the current branch to be tested, which, in the event of a difference in potential, would result in a current flow. If this is the case, a test can be performed using a downstream evaluation circuit whether the electrical potential detected may be suitable for maintaining operation of the connected load in spite of the open switching means, which indicates a fault in respect of the combination of load and load switching means. Provision is made in this case to open the other switching means in order to prevent unwanted and potentially hazardous continued operation of the load.

Potential sources of faults in respect of such undesirable electric potentials are the electrical connections of the load to the supply connections by way of the respective current branches of the load switching device as well internal electrical load branches of the load. Said current branches or load branches can be realised at least in sections in the form of cables, the insulation of which may be damaged due to mechanical influences. A situation may arise involving an undesirable electrical connection to an external electric potential, for example a supply potential, earth potential or functional earth as a result of this. Consequently, reliable disconnection, where necessary, of the load connected to the load connections upon activation of just one of the two switching means may be called into question. Additionally or alternatively, a situation may arise in which one of the switching means, which may be a semiconductor in particular, has a fault, in particular damage to semiconductor layers. In such a situation, for example, the switching means fails to disconnect or only partly disconnects the electrical connection between the supply connection and the load connection in spite of a correct control signal to disconnect the electrical connection between the supply connection and the load connection. This also calls reliable disconnection of the load into question. Tests can be performed in this and other situations that are not explained in further detail where undesirable electric potentials are present in at least one of the current branches, to see whether such faulty electrical connections are present. Such tests can be performed using the load switching device and the test branches provided therein. If a faulty electrical connection to an electric potential, in particular a further supply potential or earth potential, is detected in at least one of the current branches, an appropriate response for the load switching device can then be instigated.

Advantageous embodiments of the invention are the subject of the sub-claims.

It is advisable for the measuring device to be configured as a current measuring device. The measuring device may, for example, comprise one or more Hall sensors, which detect magnetic fields in the test branch thus enabling a conclusion to be drawn regarding the current flowing through the test branch. Alternatively, provision can be made for the current to be measured by way of one or more magnetoresistive sensors that are assigned to the test branch. The magnetic field dependent resistance of such sensors enables detection of the current flow.

One embodiment of the invention makes provision for the current measuring device to comprise an, in particular, low-ohm measuring resistor, as well as a voltage amplifier assigned to the measuring resistor. Cost-efficient and robust current measurement can be provided as a result of this. The measuring resistor is preferably low-ohm, in particular with a resistance of less than 1 ohm Such low-ohm configuration of the measuring resistor enables rapid as possible discharging of the electrical energy stored capacitively in the load and consequently the prerequisites exist within a short space of time for measuring currents following the discharging process, which are based on potentially faulty electrical connections to an electric potential, in particular a further supply potential or earth potential, in at least one of the current branches. However, in the process certain requirements must be imposed in terms of the voltage amplifier, which amplifies the voltage that dips in the measuring resistor. Said voltage amplifier should be selected such that it enables a high differential gain with high common-mode rejection. The voltage amplifier is therefore configured as an operational amplifier, for example, in particular as a rail-to-rail operational amplifier or as an instrument amplifier.

Provision is made in a further embodiment of the invention that a capacitor is connected in parallel to the measuring resistor. Said parallel connection can be used to speed up the discharging process for the load prior to taking the measurement in order to detect faulty electrical connections to an electric potential, in particular a further supply potential or earth potential, in at least one of the current branches, as the capacitor behaves like an electrical conductor, at least temporarily, when the test switch is closed.

Preferably an output terminal of the voltage amplifier is connected to an input terminal of a comparing device, which compares an output signal of the voltage amplifier with a preset reference signal and to emit a comparison signal to a signal terminal. The task of the comparing device consists in comparing the voltage signal emitted by the voltage amplifier proportional to the current flow through the measuring resistor with a reference signal, preferably also provided as voltage level, and to generate a comparison signal therefrom.

It is advantageous if a safety-oriented control device is assigned to the comparing device, wherein the safety-oriented control device is connected to the signal terminal and to the first switching means and to the second switching means and activates the first and the second switching means depending on the comparison signal. The task of the safety-oriented control device therefore consists in making a decision based on the comparison signal provided by the comparing device whether there is a faulty electrical connection to an electric potential, in particular a further supply potential or earth potential, in at least one of the current branches that requires activation of the switching means and thus disconnection of the load, or whether the load can continue to be operated without impacting on the switching means. The incoming comparison signal is evaluated for this purpose in the safety-oriented control device based on a preset signal interval. A check is made in the safety-oriented control device, for example, whether a comparison signal value falls below or exceeds a threshold value for a maximum current flow by way of the measuring resistor. In the event that the threshold value is exceeded, which is assessed as a fault, the safety-oriented control device can be set up to activate the two switching means in order to perform safety-oriented disconnection of the load.

A further embodiment of the invention makes the provision that a capacitor is connected or looped between the first and second supply connections and/or a free-wheeling diode is connected or looped in between the first and second measuring points. The task of the capacitor consists in ensuring as rapid as possible provision of electrical energy to the load following successful completion of the testing procedure. The testing procedure should essentially be carried out such that the operating load experiences no change in state in spite of the temporary disconnection of the electrical supply during testing. This should prevent the undesirable appearance of wear and tear, which may occur in magnetic valves, for example, due to movement of the valve body if these are disconnected for too long. Accordingly, it is advantageous to provide the electrical energy required by the load again, without delay where possible, at the end of the testing procedure, in the event of a positive outcome, i.e. if no relevant faulty electrical connection to an electric potential, in particular a further supply potential or earth potential has been detected in the current branch tested. The capacitor is provided in order to keep the requirements for the electrical energy source, which is connected to the supply connections and which supplies the load with electrical energy during normal operation, to a minimum Said capacitor can release its stored charge to the load, at least in part, when the respective switching means closes again. Thus, the period during which the testing procedure can be carried out without repercussion on the load, compared with an energy supply to the load provided exclusively by the electrical energy source, can be extended which makes it easier to perform the test.

Additionally or alternatively, a free-wheeling diode can be connected or looped in between the first and second measuring points. The task of the free-wheeling diode consists in dissipating the magnetic energy stored inductively in the load during normal operation for carrying out the testing procedure as quickly as possible so that the current measurement for the search for cross-circuits can be made as quickly as possible after the respective switching means has opened.

The object of the invention is achieved for a method for operating a safety-oriented load switching device including the following steps for carrying out the method: closing a first switching means for connecting a first load connection to a first supply connection and closing a second switching means for connecting a second load connection to a second supply connection in order to supply a load connected to the load connections with electrical energy, carrying out a testing procedure comprising the steps: opening one of the switching means and closing a test switch, which is included in a test branch that extends from a measuring point located between the open switching means and the load connection assigned to said switching means and the supply connection of the still closed switching means, and measuring a current in the test branch to determine a current value, comparing the obtained current value with a preset current value, either emitting a fault signal if the obtained current value is higher than the preset value and opening the respective other switching means to disconnect the load safely; or opening the test switch and closing the open switching means if the obtained current value is not higher than the preset value and testing the respective other switching means using the respective other test branch.

The method is based accordingly on the load being in operation in the first instance and testing of the load switching device as well as the load connected to it for any cross circuits whilst maintaining the operating state for the load. The duration of the testing procedure must therefore be measured/dimensioned such that, in spite of the electrical supply to the load being disconnected, which results from appropriate activation of one of the switching means, there is no repercussion on the load, which has a certain mechanical inertia, for example, and therefore experiences no change in state, at least for a certain period of time, in spite of the electrical supply being disconnected. This enables testing procedures to be carried out for the two current branches in any order and at constant or variable intervals with the help of the respectively assigned test branches, without having to consider the operating state of the load. It is therefore irrelevant in terms of the testing procedure whether the load is in an operating state or idle state when testing the respective current branch, as it is assumed in any case for the testing procedure that in electrical terms, the load is at least virtually completely without energy. However, since this state of having no energy is only maintained for a very brief period during regular operation of the load, during which period the testing procedure is carried out, this has no practical relevance for the functional state of the load, which can be a magnetic valve, for example.

Provision is made in a further embodiment of the method that after the test switch has closed, a preset waiting period, preferably 150 microseconds, in particular 200 microseconds, passes before a current measurement is taken and/or a current value is evaluated. Where the measuring resistor is configured appropriately, this period is long enough to ensure there is no electrical energy at all in the load, which is a prerequisite for proper performance of the subsequent testing procedure to detect faulty electrical connections to an electric potential, in particular a further supply potential or earth potential, in at least one of the current branches.

Provision is made in a further advantageous embodiment of the method for emitting the fault signal or closing the first switching means after a period of 300 microseconds, in particular 250 microseconds. In the event of a positive test result, i.e. no relevant faulty electrical connection to an electric potential, in particular a further supply potential or earth potential, is detected in the current branch tested, enough electrical energy is once again supplied to the load within a period of 300 microseconds after the supply energy has been switched off in order to ensure continued operation of the load without repercussions.

BRIEF DESCRIPTION OF THE DRAWINGS

An advantageous embodiment of the invention is shown in the figures.

DETAILED DESCRIPTION

Figure 1:
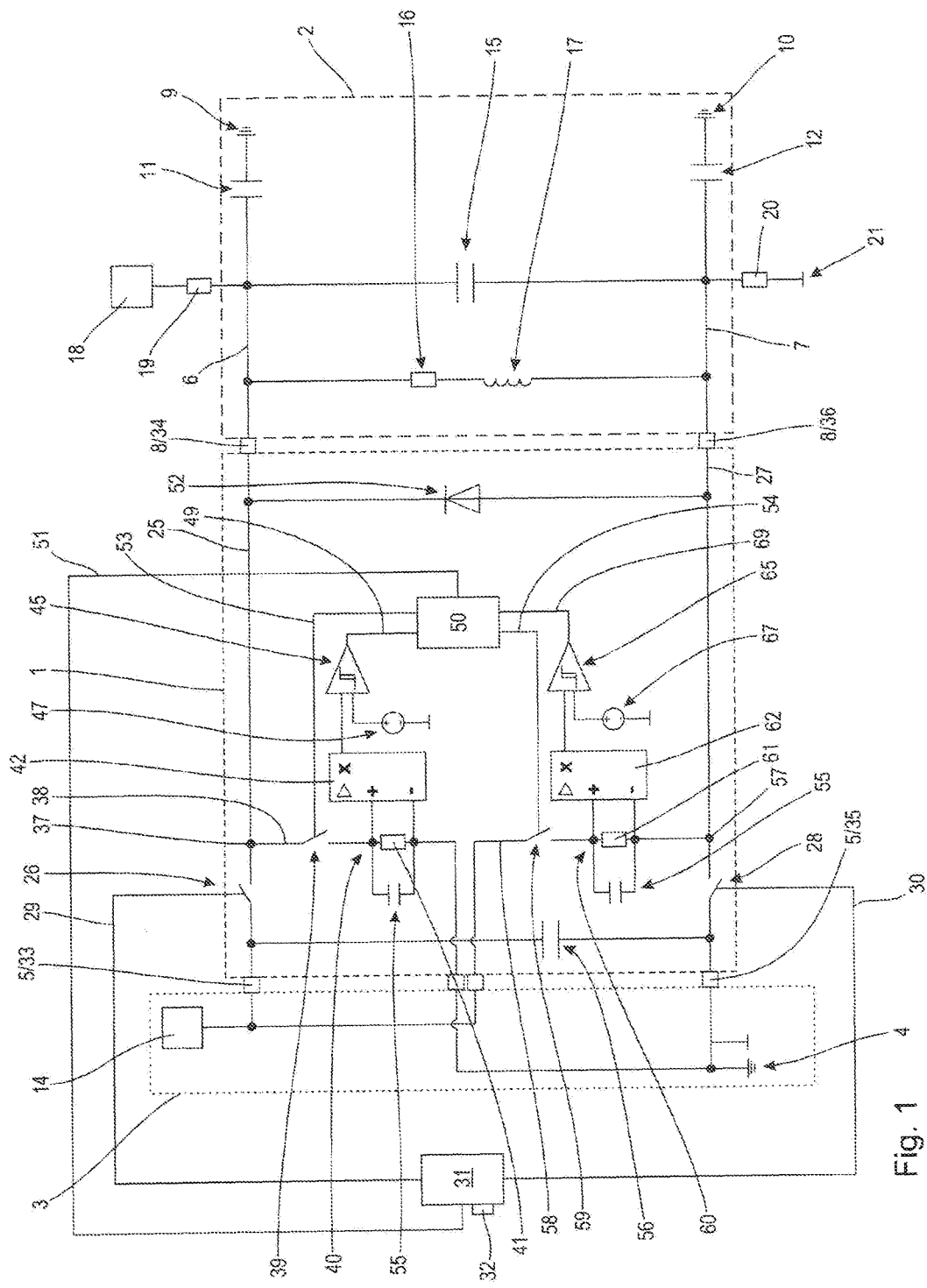
FIG. 1 shows a sample circuit configuration for a safety-oriented load switching device, which is electrically connected to a supply source and a load.

A load switching device 1 shown in FIG. 1 serves to influence the electrical supply of a purely schematically shown load 2 and is integrated for this purpose between the load 2 and an electrical supply source 3.

The electrical supply source 3 is a direct current source, for example, which provides a supply voltage of 24 volts based on a functional earth connection 4. Provision is made, for example, that the load switching device 1 is connected to the supply source 3 by means of a total of four electrical connectors 5 (not shown in more detail).

Purely for illustrative purposes, the schematically illustrated load 2 comprises a first load branch 6 and a second load branch 7. Each of the load branches 6, 7 extends between a connector 8, which is provided for electrical connection to the load switching device 1, and a functional earth connection 9 and 10 respectively. A capacitor 11 or 12 respectively is switched to earth on each of the load branches 6, 7 and is provided for EMC adjustment of the load 2.

A load capacitor 15 is switched between the load branches 6 and 7. A series connection of a load resistor 16 and a load inductor 17 is switched in parallel to the load capacitor 15. Thus, purely for illustration purposes, the load 2 has a resistive part, an inductive part and a capacitive part.

A voltage source 18 is also connected to the first load branch 6 by way of a resistor 19, wherein this arrangement of voltage source 18 and resistor 19 is intended to symbolise a faulty electrical connection to an electric potential, in particular a further supply potential, in the load branch 6 on the supply side, wherein said fault does not necessarily have to be present, but simply may be present, and is intended to be detected with the help of the load switching device 1 described in more detail below.

Additionally, the second load branch 7 is connected to an earth connection 21 by way of a resistor 20, wherein this arrangement of resistor 20 and earth connection 21 is intended to symbolise a faulty electrical connection to an electric potential, in particular a further supply potential, in the load branch 7 on the earth side, wherein said fault does not necessarily have to be present, but simply may be present, and is intended to be detected with the help of the load switching device 1 described in more detail below.

The load switching device 1 shown in FIG. 1 comprises a first current branch 25, which extends between a first supply connection 33 and a first load connection 34 and into which a first switching means 26, preferably configured as a semiconductor switch, is integrated/looped in. The first current branch 25 is thus configured for a first electrical connection between the supply source 3 and the first load branch 6 of the load 2.

Furthermore, the load switching device 1 comprises a second current branch 27, which extends between a second supply connection 35 and a second load connection 36 and into which a second switching means 28, preferably configured as a semiconductor switch, is integrated/looped in. The second current branch 28 is thus configured for a second electrical connection between the functional earth connection 4 and the second load branch 7 of the load 2.

Both switching means 26, 28 are electrically connected to a safety-oriented control device 31 by way of control wires 29, 30, the control device 31 provides electrical control signals to the respective switching means 26 and 28 in order to switch the switching means 26 and 28 between an open position shown in FIG. 1 and a closed position (not shown). Preferably, the safety-oriented control device 31 is configured as a microprocessor. The safety-oriented control device 31 comprises, for example, a communications interface 32, which communicates with a higher-ranking control system, which is not shown in greater detail, in particular with a programmable logic controller (PLC). The communications interface 32 provides parallel or series communication for example, in particular communication according to a preset bus protocol.

A first measuring point 37 is provided in a section of the first current branch 25, which extends between the first switching means 26 and the first load connection 34. A first test branch 38, which is electrically connected to the functional earth connection 4, is connected to said first measuring point. A first test switch 39, which can be switched between an open position shown in FIG. 1 and a closed position (not shown) is integrated/looped into the first test branch 38. Furthermore, a first current measuring device 40, which determines a current flow through the first test branch 38, is assigned to the first test branch 38. For purely illustrative purposes, the first current measuring device 40 comprises a first measuring resistor 41 and a first voltage amplifier 42, which determines a drop in potential by way of the first measuring resistor 41. Provision can be made, for example, that the first measuring resistor 41 is configured as low ohm, in particular with a resistance of less than 1 ohm and/or that the first voltage amplifier 42 is configured as an operational amplifier, in particular as a rail-to-rail operational amplifier or instrument amplifier.

An output terminal of the first voltage amplifier 42 is connected to a first input terminal of a first comparing device 45, which can be configured as a comparator for example. A first constant voltage source 47, which is provides a reference voltage, is connected to a second input terminal of the first comparing device 45. The first comparing device 45 uses said reference voltage for comparison with the output signal from the voltage amplifier 42 and emits a comparison signal to a first signal terminal depending on the result of said comparison.

A second measuring point 57 is provided in a section of the second current branch 27, which extends between the second switching means 28 and the second load connection 36. A second test branch 58, which is electrically connected to the voltage source 14, is connected to said second measuring point. The second test branch 58 has the same components as the first test branch 38 and consequently a description of these components provided with reference numerals that are 20 places higher, 59 to 69, is not repeated.

The signal terminals of the comparing devices 45, 65 are connected to a test control system 50 by way of signal wires 49, 69, which is coordinates the testing procedure in both test branches 38 and 58 and communicates with the safety-oriented control device 31 by way of a communication line 51. Preferably, the test control system 50 is configured as a microprocessor and provided as an integral component of the load switching device 1.

In an embodiment that is not shown, the test control system and the load switching device are configured as separate entities.

The test control system 50 electronically activates the two test switches 39 and 59 by way of respectively assigned test switch wires 53 and 54.

A diode 52, which serves as a free-wheeling diode/recovery diode, is connected between the first current branch 25 and the second current branch 27, and lies in a reverse direction to the electrical voltage present between the two current branches 25 and 28 during normal operation of the load 2. The task of the diode 52 consists in reducing voltage peaks, which occur when the supply voltage calculated for the supply connections 33, 35 is disconnected owing to the self-induction of any load inductance present in the load 2 and thus preventing in particular impairment of the load 2 and/or the load switching device.

Figure 2:
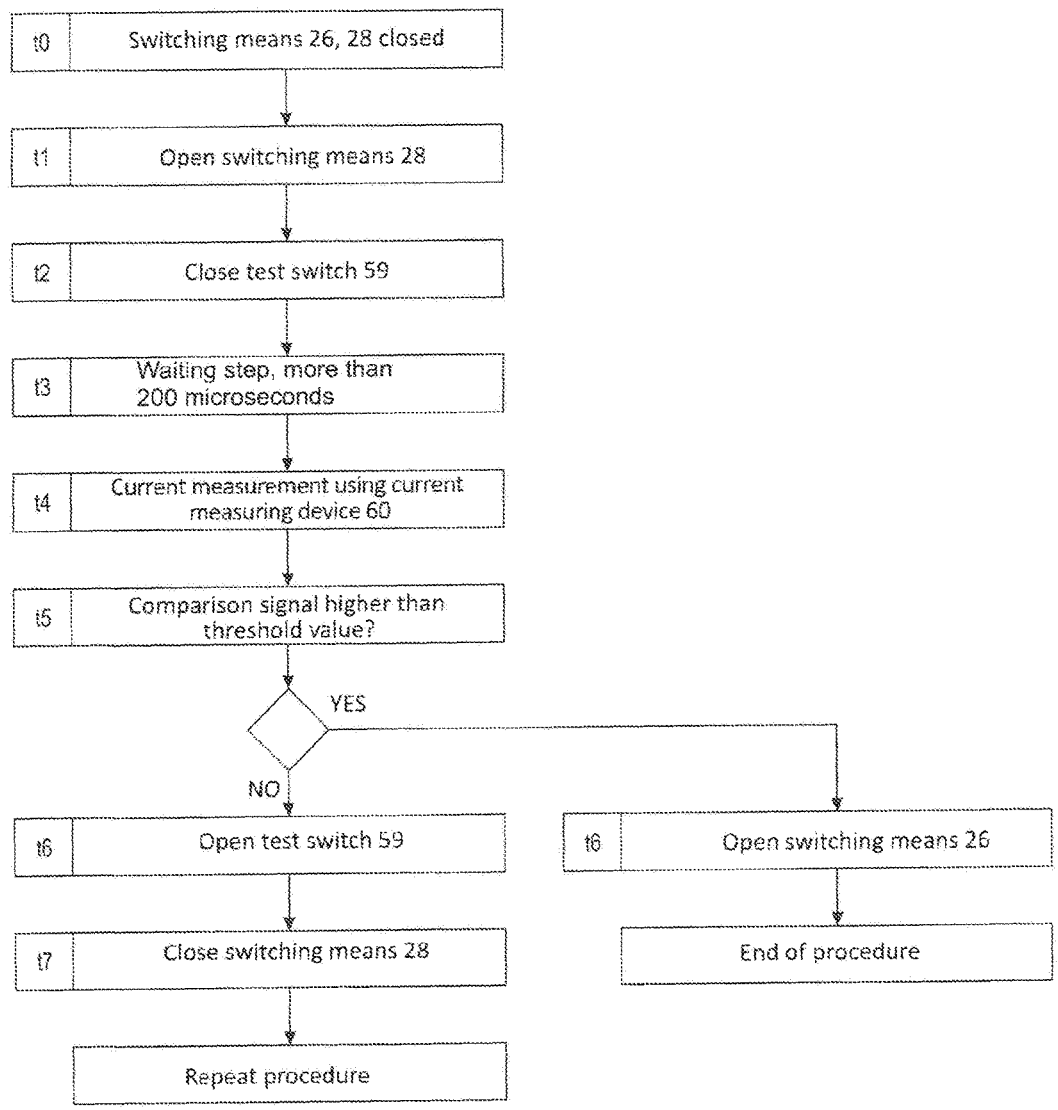
FIG. 2 shows a flowchart for carrying out a testing procedure for the safety-oriented load switching device according to FIG. 1.

FIG. 2 is a schematic view of a testing procedure wherein it is assumed that the two switching means 26, 28 are closed at time t0 and thus electrical supply to the load 2 takes place by way of the load switching device 1 and consequently the load 2 assumes an operating state that is different from an idle state where no energy is supplied. Testing of the second current branch 27 with the help of the second test branch 58 is described below. Similarly, the first current branch 25 can also be checked prior or subsequent to this with the help of the first test branch 38 without the testing sequence being mandatory.

To test the second current branch 27 for potential cross circuits, in particular compared with an earth potential, as it is represented by the resistor 21 connected between the load branch 7 and the earth connection 7 and assigned to the load 2 as a symbol of such faulty electrical connection of the load branch 7 to an electric potential, in particular an earth potential, the second switching means 28 is opened at time t1 while the first switching means 26 is kept in a closed position.

At time t2, the second test switch 59 is closed and consequently an electrical connection is established between the second load branch 7 and the voltage source 14 by way of the second test branch 58. As a result of this step, the two load branches 6, 7 have the same electric potential, the load 2 is thus short-circuited, wherein the electrical energy stored in the load capacitor 15 and in the capacitors 11 and 12 is reduced by way of the measuring resistor 61. If a load inductance 17 is intended to be provided in the load 2, the electrical energy inductively stored there will be reduced with the help of the diode 52.

At the end of the waiting step starting at time t3, for which a period of between 150 and 200 microseconds can be provided, for example, the current measurement is taken at time t4 at the second measuring resistor 61 with the help of the second current measuring device 60. A voltage value determined in the course of current measurement and amplified by the second voltage amplifier 62, which represents the current through the second measuring resistor 61, is passed onto the comparing device 65 and compared there with the reference voltage of the second constant voltage source 67. The comparison signal resulting from this comparison is then made available to the test control system 50 by way of the second signal wire 69.

The comparison signal is compared with a preset threshold value in the test control system 50 at time t5.

If the value of the comparison signal value is lower than the threshold value, proper function of the load 2 and load switching device 1 is assumed. A control signal is emitted accordingly by way of the test switch wire 54 at time t6 to bring the test switch 59 from the closed position back into the open position. A positive status signal is also emitted by the test switch 50 to the safety-oriented control device 31 by way of the communications wire 51 in order to effect the closing of the second switching means 28 at time t7. In this case, testing of the first current branch 25 using the first test branch 38 can be carried out similarly as above, where appropriate after a preset period has elapsed. This is indicated in FIG. 2 by the 'repeat procedure' box.

If the value of the comparison signal is higher than the threshold value, a faulty electrical connection of the second current branch 27 to an electric potential, in particular an earth potential, must be assumed. A negative status signal is emitted accordingly by the test switch 50 to the safety-oriented control device 31 by way of the communications wire 51 in order to open the first switching means 26 and thus effect disconnection that is as complete as possible of the load 2 from the supply source 3. Said disconnection ends the procedure and reconnection does not take place until after testing and resetting of the load switching device 1 and the load 2.

Particularly rapid discharging of the capacitors 11, 12 and the load capacitor 15 can be achieved with the help of the optional capacitors 55, which are connected in parallel to the resistors 41 and 61, after the switching means 26 or 28 have opened and the test switch 39 or 59 has closed.

Alternatively or additionally to the optional capacitors 55, the optional capacitor 56 can be provided, which connects the two current branches 25 and 27 between the supply connections 33 and 35 and the respective switching means 26 and 28, and which enables rapid recommissioning of the load 2 after the testing procedure has been completed, as the energy stored in the capacitor 57 can be provided particularly quickly to the capacitors 11, 12 and the load capacitor 15 and thus less strain is placed on the supply source 3.

The invention claimed is:

1. A safety-oriented load switching device for electrical switching of an automation component, comprising a first current branch, which extends from a first supply connection to a first load connection and which includes a first switching means, which selectively interrupts the first current branch, and comprising a second current branch, which extends from a second supply connection to a second load connection and which includes a second switching means, which selectively interrupts the second current branch, wherein a first test branch is connected to a first measuring point located between the first switching means and the first load connection, wherein the first test branch is connected to the second supply connection and comprises a series connection of a first test switch and a first measuring device and wherein a second test branch is connected to a second measuring point located between the second switching means and the second load connection, wherein the second test branch is connected to the first supply connection and comprises a series connection of a second test switch and a second measuring device.

2. The safety-oriented load switching device according to claim 1, wherein the measuring device is configured as a current measuring device.

3. The safety-oriented load switching device according to claim 2, wherein the current measuring device comprises a measuring resistor and a voltage amplifier assigned to the measuring resistor.

4. The safety-oriented load switching device according to claim 3, wherein a capacitor is connected in parallel to the measuring resistor.

5. The safety-oriented load switching device according to claim 3, wherein an output terminal of the voltage amplifier is connected to an input terminal of a comparing device, which compares an output signal from the voltage amplifier with a preset reference signal and to emit a comparison signal to a signal terminal.

6. The safety-oriented load switching device according to claim 5, wherein a safety-oriented control device is assigned to the comparing device and wherein the safety-oriented control device (31) is connected to the signal terminal and to the first switching means and to the second switching means and activates the first switching means and the second switching means depending on the comparison signal.

7. The safety-oriented load switching device according to claim 1, wherein a capacitor is connected between the first supply connection and the second supply connection and/or a free-wheeling diode is connected between the first measuring point and the second measuring point.

8. A method for operating a safety-oriented load switching device comprising the steps:
   closing a first switching means to connect a first load connection to a first supply connection;
   closing a second switching means to connect a second load connection to a second supply connection in order to supply a load connected to the load connections with electrical energy;
   carrying out a testing procedure comprising the steps:
      opening one of the switching means and closing a test switch, which is included in a test branch that extends from a measuring point located between the open switching means and the load connection assigned to said switching means and the supply connection of the still closed switching means; and
      measuring a current in the test branch to determine a current value;
   comparing the obtained current value with a preset current value;
   either emitting a fault signal if the obtained current value is higher than the preset current value, and opening the respective other switching means to disconnect the load safely, or opening the test switch and closing the open switching means if the obtained current value is not higher than the preset current value; and
   carrying out the testing procedure for the respective other switching means using the respective other test branch.

9. The method according to claim 8, wherein after closing the test switch, a preset waiting period passes prior to measuring current and/or evaluating a current value.

10. The method according to claim 8, wherein a fault signal is emitted or the first switching means is closed after a period of 300 microseconds.

* * * * *